United States Patent [19]
Degenhardt

[11] Patent Number: 5,828,589
[45] Date of Patent: Oct. 27, 1998

[54] SELF-ADAPTIVE TRANS-HYBRID BALANCE FILTER

[75] Inventor: Achim Degenhardt, Germering, Germany

[73] Assignee: Siemens Aktiengesellschaft, Munich, Germany

[21] Appl. No.: 605,902

[22] Filed: Feb. 23, 1996

[30] Foreign Application Priority Data

Feb. 23, 1995 [DE] Germany .................. 195 06 324.4

[51] Int. Cl.$^6$ ............... G06F 17/10; H04M 1/00; H04M 9/00; H04M 9/08
[52] U.S. Cl. ............... 364/724.19; 364/724.011; 379/402; 379/403; 379/404
[58] Field of Search .............. 364/724.19, 724.03, 364/724.011, 724.2, 724.11–724.14; 375/103, 345, 350; 379/388–390, 399–404; 395/2.34

[56] References Cited

U.S. PATENT DOCUMENTS

| | | | |
|---|---|---|---|
| 5,138,568 | 8/1992 | Gazsi et al. | 364/724.03 |
| 5,146,470 | 9/1992 | Fujii et al. | 375/103 |
| 5,233,550 | 8/1993 | Gazsi | 364/724.19 |
| 5,278,780 | 1/1994 | Eguchi | 364/724.19 |
| 5,315,621 | 5/1994 | Lucioni et al. | 375/103 |
| 5,586,180 | 12/1996 | Degenhardt et al. | 379/389 |

OTHER PUBLICATIONS

Publ. "CMOS Subsriber Line Audio Processing Circuit Including Adaptive Balance", (Poole et al.), 1988.
Publication Widrow/Stearns, 1985, pp. 99–295, "Adaptive Signal Processing".

*Primary Examiner*—Emmanuel L. Moise
*Attorney, Agent, or Firm*—Herbert L. Lerner; Laurence A. Greenberg

[57] ABSTRACT

An adaptive balance filter includes a transmission path, a reception path, and an adaptive filter having a signal output, a coefficient output for outputting filter coefficients, an error signal input, and a signal input coupled to the transmission path. There is a main filter which has a signal output, a signal input coupled to the transmission path, and a coefficient input terminal. There is also a first subtractor which has one input coupled to the reception path, another input coupled to the signal output of the main filter, and an output forming a further course of the reception path. A second subtractor has one input coupled to the reception path, another input coupled to the signal output of the adaptive filter, and an output coupled to the error signal input of the adaptive filter. A transfer device is connected between the adaptive filter and the main filter and has a control input for loading the filter coefficients of the adaptive filter into the main filter upon command of a corresponding copy signal. A transfer control device having first, second and third inputs is provided. The transfer control device ascertains echo attenuations of the adaptive filter and the main filter from the first, second and third inputs, comparing two echo attenuations with one another, and sending a corresponding copy signal to the transfer device in the event that the echo attenuation of the adaptive filter is higher than the echo attenuation of the main filter.

11 Claims, 2 Drawing Sheets

SELF-ADAPTIVE TRANS-HYBRID BALANCE FILTER

BACKGROUND OF THE INVENTION

Field of the Invention

The invention relates to an adaptive balance filter. More specifically, to an adaptive balance filter having an adaptive filter which has a signal output, a coefficient output for outputting its filter coefficients, an error signal input, and a signal input coupled to a transmission path. The adaptive balance filter also has a main filter which has a signal output, a signal input coupled to the transmission path, and a coefficient input for loading filter coefficients. There is also a first subtractor which has one input coupled to a reception path, another input coupled to the output of the main filter and an output which forms a further course of the reception path. The adaptive balance filter further has a second subtractor which has one input coupled to the reception path, another input coupled to the signal output of the adaptive filter and an output coupled to the error signal input of the adaptive filter. A transfer device is provided and is connected between the coefficient output of the adaptive filter and the coefficient input of the main filter and has a control input for loading the filter coefficients of the adaptive filter into the main filter upon the appearance of a corresponding copy signal and a transfer device.

Such balance filters are known, for instance, from an article entitled: CMOS Subscriber Line Audio Processing Circuit Including Adaptive Balance, by S. J. Poole, G. Surace, B. Singh and N. P. Dyer, in International Symposium on Circuits and Systems, Helsinki, Jun. 7–9, 1988, pp. 1931–1934, and from Published European Patent Application 0 491 063. In those references, loading of the coefficients of the adaptive filter into the main filter is carried out by different criteria, which produce optimal results only for some of the possible instances of operation.

Due to the two-wire transfer, the transmitted and received signals of both subscribers are present simultaneously on service lines of a telephone. The transmission directions are separated from one another in a bridge circuit (hybrid) and decoupling of the signal paths depends on the quality of adaptation of the line simulation to the line impedance. The result is a direct coupling of the transmitted signal (signal of one subscriber) into the reception channel of his or her telephone, which can be expressed as trans-hybrid loss transmission. The received signal thus includes two components. First, it includes the signal arriving from the service line (signal of the other subscriber), and it also includes the coupled-in transmitted signal. The coupled-in transmitted signal is received by the one subscriber as an echo.

Since the impedances of the subscriber service lines can vary and moreover are connection-dependent as well, the trans-hybrid loss varies over a wide range when a fixed line simulation is employed. In the event that the adaptation is optimal, very great attenuations are attained. Conversely, in the event of an open line, they can even be negative. The transmitted signal would then be returned, amplified, to the reception channel.

In telephones with cords, for instance, the coupled-in transmitted signal is not annoying, because of the brief signal transit time between the microphone and the loudspeaker. Conversely, in a cordless telephone, which employs time-slot multiplexing, the coupled-in transmitted signal is perceived as very annoying, because of the relatively long signal transit times between the microphone and the loudspeaker.

SUMMARY OF THE INVENTION

It is accordingly an object of the invention to provide an adaptive balance filter, which overcomes the hereinaforementioned disadvantages of the heretofore-known devices of this general type and which assures optimal power adaptation in every operating mode.

With the foregoing and other objects in view there is provided, in accordance with the invention, an adaptive balance filter, comprising a transmission path; a reception path; an adaptive filter having a signal output, a coefficient output for outputting filter coefficients, an error signal input, and a signal input coupled to the transmission path; a main filter having a signal output, a signal input coupled to the transmission path, and a coefficient input for loading filter coefficients; a first subtractor having one input coupled to the reception path, another input coupled to the signal output of the main filter, and an output forming a further course of the reception path; a second subtractor having one input coupled to the reception path, another input coupled to the signal output of the adaptive filter, and an output coupled to the error signal input of the adaptive filter; a transfer device being connected between the coefficient output of the adaptive filter and the coefficient input of the main filter and having a control input for loading the filter coefficients of the adaptive filter into the main filter upon an appearance of a corresponding copy signal; and a transfer control device having first, second and third inputs, the first input being coupled to the output of the second subtractor, the second input being coupled to the one input of the second subtractor, and the third input being coupled to the output of the main filter; the transfer control device ascertaining echo attenuations of the adaptive filter and the main filter from signals at the first, second and third inputs, comparing two echo attenuations with one another, and sending a corresponding copy signal to the transfer device in the event that the echo attenuation of the adaptive filter is higher than the echo attenuation of the main filter.

The object of the invention is to achieve such high adaptation quality, at relatively little expense for all possible operating cases, that it meets the requirements of the DECT Standard (DECT=Digital European Cordless Telephone), which contemplates time-slot multiplexing.

In accordance with another feature of the invention, there is provided a first form filter connected between the one input of the second subtractor and the reception path; a second form filter having a transmission behavior being identical to the first form filter and being connected between the transmission path and the signal input of the adaptive filter; and a third form filter having a transmission behavior being identical to the first form filter and being connected between the output of the main filter and the third input of the transfer control device.

In accordance with a further feature of the invention, the transfer control device has a quality comparison device and a copy control device; the transfer control device including a third subtractor having one input forming the second input and another input forming the third input of the transfer control device; a first absolute value former having an input forming the first input of the transfer control device; a second absolute value former having an input being connected to the one input of the third subtractor; a third absolute value former connected downstream of the third subtractor; first, second and third logarithm modules each being connected downstream of a respective one of the first, second and third absolute value formers and each having an output; a fourth subtractor having inputs each being connected to the output of a respective one of the first and second logarithm modules; a fifth subtractor having inputs each being connected to the output of a respective one of the second and third logarithm modules; first and second low-pass filters each being connected downstream of a respective one of the fourth and fifth subtractors and each having an output; and a sixth subtractor having inputs being connected to the outputs of the first and second low-pass filters, and an output supplying a quality difference signal; the copy control device having an input being coupled to the output of the sixth subtractor, for comparing the quality difference signal with a first comparison value and generating a copy signal for the transfer device if the quality difference signal and the first comparison value differ in a certain direction, the first comparison value being set equal to a current value of the quality difference signal.

In accordance with an added feature of the invention, there is provided a third low-pass filter connected downstream of the sixth subtractor.

In accordance with an additional feature of the invention, the transfer control device includes: devices for ascertaining a power of a transmitted signal present at the input of the adaptive filter and a power of a reception signal present at the one input of the second subtractor; and an enable device connected downstream of the devices for ascertaining the transmission and reception power, for outputting an enable signal to the copy control device to enable the copy signal whenever the transmission power signal exceeds a first reference value and a difference between the transmission power signal and the reception power signal exceeds a second reference value.

In accordance with yet another feature of the invention, the enable signal is also delivered to the adaptive filter; and the adaptive filter does not adapt until the enable signal appears.

In accordance with yet a further feature of the invention, the transfer control device has an operating mode recognition device for evaluating a signal at the input of the adaptive filter for broad blandness and narrow bandedness, and for supplying an enable signal for the copy control device upon the presence of a wideband signal.

In accordance with yet another an added feature of the invention, the operating mode recognition device includes a filter bank being triggered with the input signal of the adaptive filter and having a plurality of frequency band-specific outputs; further absolute value formers connected downstream of the outputs of the filter bank; further low-pass filters being connected downstream of the further absolute value formers and having outputs; a mean value former being connected to the outputs of the low-pass filters and having an output; a constant multiplier being connected downstream of the output of the mean value and having an output; and an evaluation device connected to the output of the constant multiplier and to the outputs of the low-pass filters, for comparing various frequency band-specific signals present at the outputs of the low-pass filters with a comparison signal output by the constant multiplier and outputting a bandwidth signal if the comparison signal is exceeded by a maximum of two frequency-specific signals.

In accordance with yet another an additional feature of the invention, there is provided a comparator having one input receiving a quality signal, another input receiving a attenuation reference signal corresponding to a given echo attenuation, and supplying an output signal; and a decision element linking the bandwidth signal and the output signal of the comparator to one another for supplying an enable signal for the copy control device in the presence of a bandwidth signal corresponding to a wide bandedness of the signal at the output of the adaptive filter and in the presence of an output signal of the comparator corresponding to a certain echo attenuation.

In accordance with again another feature of the invention, if the enable signal is absent, the copy control device resets an internal counter, generates a copy control signal for copying the coefficients of the adaptive filter to the main filter, sets the output signal of the second low-pass filter to be equal to the quality signal, and sets a maximum value variable to be equal to the quality signal; and otherwise if the first enable signal is absent, the copy control device resets the internal counter; and otherwise if the output signal of the first low-pass filter is greater than the maximum value variable, the copy control device resets the internal counter, generates a copy control signal for copying the coefficients of the adaptive filter to the main filter, sets the output signal of the second low-pass filter to be equal to the quality signal, and sets the maximum value variable to be equal to the quality signal; and otherwise, if the quality difference signal is greater than a quality parameter, the copy control device resets the internal counter, generates the copy control signal, sets the output signal of the second low-pass filter to be equal to the quality signal, and sets the maximum value variable to be equal to the quality signal.

In accordance with again a further feature of the invention, otherwise: if the quality difference signal is greater than zero and the quality signal is greater than a limit value parameter, and if a counter state is greater than a time parameter, the copy control device resets the internal counter, generates the copy control signal, sets the output signal of the second low-pass filter to be equal to the quality signal, and sets the maximum value variable to be equal to the quality signal, and in other cases, the copy control device resets the internal counter, and otherwise resets the counter.

In accordance with a concomitant feature of the invention, the balance filter is at least partially realized in the form of a suitably programmed data processing system. Other features which are considered as characteristic for the invention are set forth in the appended claims.

Although the invention is illustrated and described herein as embodied in an adaptive balance filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
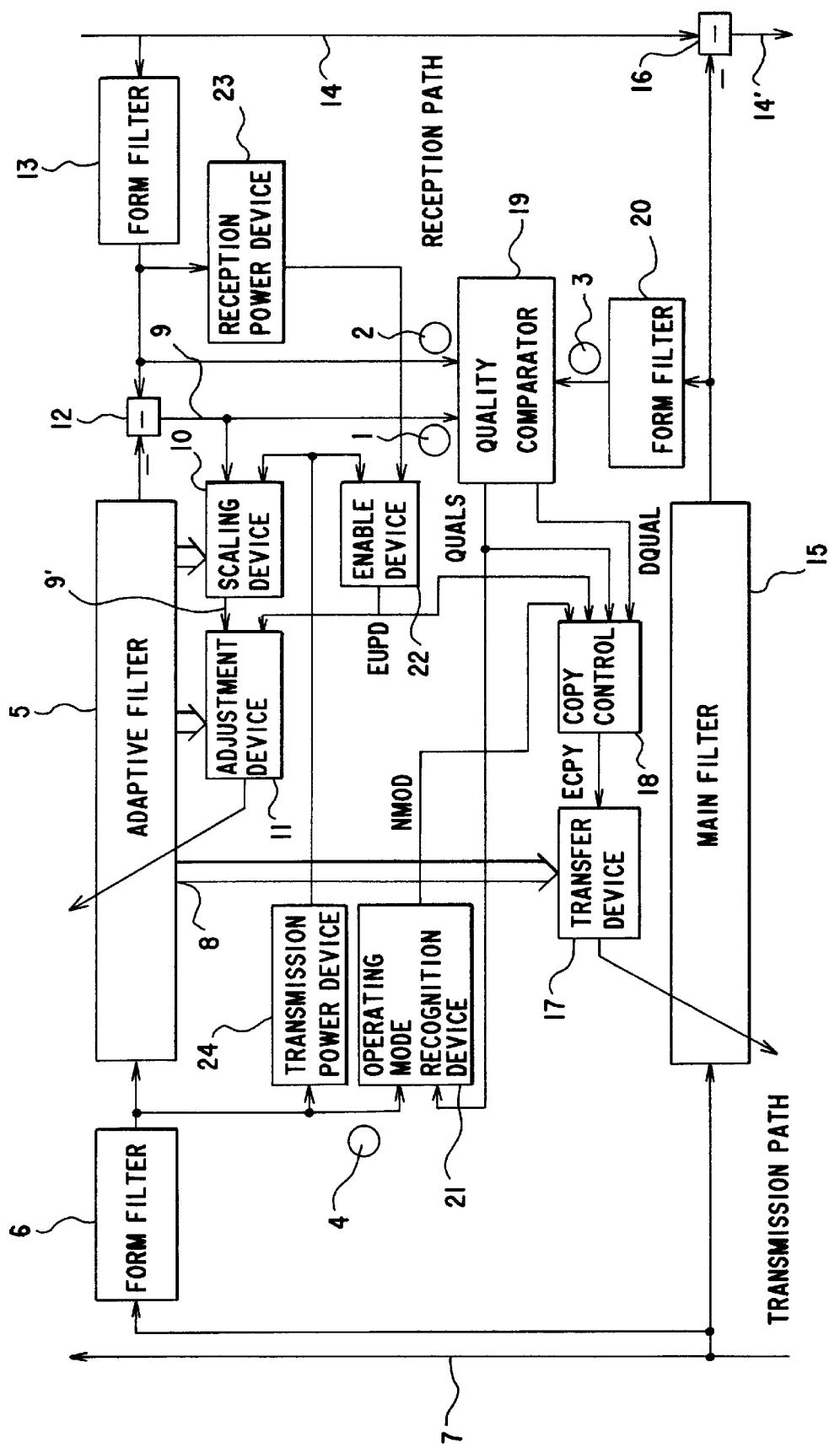
FIG. 1 is a block circuit diagram of a fundamental structure of an adaptive balance filter according to the invention.

Referring now to the figures of the drawing in detail and first, particularly, to FIG. 1 thereof, there is seen an exemplary embodiment which includes an adaptive filter 5 having a signal input that is coupled through a second form filter 6 to a transmission path 7. The adaptive filter 5 has a coefficient output 8 for outputting its filter coefficients. In order to adjust a transmission function of the adaptive filter 5, its coefficients are modified in such a way that an error signal formed in accordance with certain criteria is minimized, and from it a trigger signal for the adaptive filter is furnished. Minimizing is preferably performed by the least error squares method. This method, which is also known as the LMS (Least Mean Square) algorithm method is known, for instance, from a publication entitled: Adaptive Signal Processing, by D. Widrow and S. D. Stearns, published by Prentice-Hall Inc., Englewood Cliffs, N.J., 1985, pp. 99–140 and 288–295. Minimizing an error signal 9 is carried out by a scaling device 10 and an adjusting device 11 following it, in accordance with the LMS algorithm. The scaling device 10 is supplied with the error signal 9 for that purpose and moreover, like the adjusting device 11, it receives internal signals of the adaptive filter 5. The scaling device 10 generates a minimized error signal 9', from which the adjusting device 11 optimally adjusts the coefficients of the adaptive filter 5.

The error signal 9 is furnished by a second subtractor 12, having an inverting input which is connected to the signal output of the adaptive filter 5 and having a noninverting input which is connected, preferably with the interposition of a first form filter 13, to a reception path 14.

A main filter 15 with a transmission behavior that is identical to the adaptive filter 5 is also provided. The main filter 15 has an input which is connected to the transmission path 7 and an output which is carried to an inverting input of a first subtractor 16. The subtractor 16 is connected in the reception path 14 in such a way that its noninverting input is connected to the reception path 14 and its output forms a further reception path 14'. The main filter 15 moreover has a coefficient input, by way of which coefficients that determine its transmission function can be loaded through the use of a transfer device 17. To that end, the transfer device 17 receives the coefficients of the adaptive filter 5, which are provided at the coefficient output 8 of the adaptive filter 5 that is coupled to the transfer device 17. However, a transfer of the coefficients of the adaptive filter 5 to the main filter 15 takes place only whenever a corresponding copy signal ECPY is applied to the transfer device 17.

The copy signal ECPY is generated by a copy control device 18 as a function of signals NMOD, EUPD, QUALS and DQUAL applied to its inputs. A quality signal QUALS and a quality difference signal DQUAL are furnished by a quality comparator 19, having a first input 1 which is connected to the output of the subtractor 12, a second input 2 which is connected to the output of the form filter 13 and a third input 3 which is connected, with the interposition of a third form filter 20, to the output of the main filter 15.

The quality signal QUALS is moreover carried to one input of an operating mode recognition device 21. The operating mode recognition device 21 also receives an input 4 provided by the form filter 6 and the operating mode recognition device 21 provides an output at which an enable signal NMOD is ready. An enable signal EUPD, which is supplied not only to the copy control device 18 but also to the adjustment device 11, is generated by an enable device 22. The enable device 22 has one input being connected to a device 23 for ascertaining reception power and another input being connected to an output of a device 24 for ascertaining transmission power. The device 23 for ascertaining the reception power is connected on the input side to the output of the form filter 13. The device 24 for ascertaining the transmission power has an input which is connected to the output of the form filter 6 and an output which is also coupled to the scaling device 10.

Figure 2:
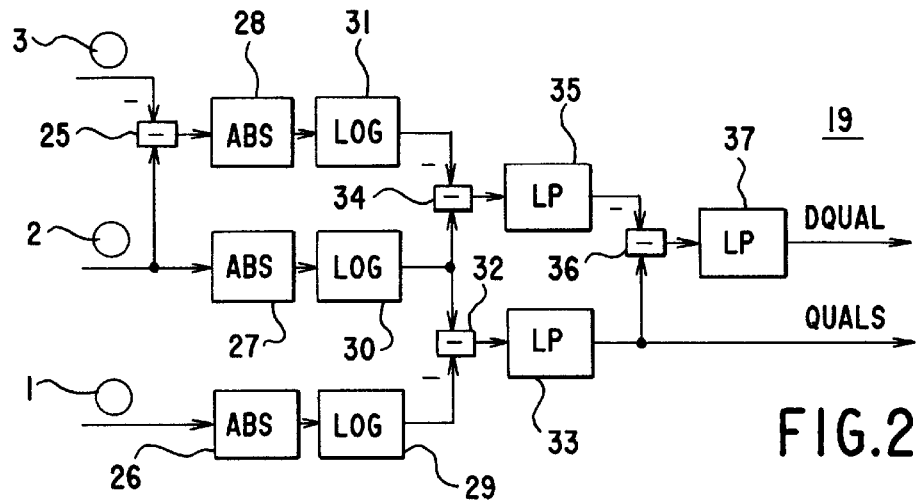
FIG. 2 is a block circuit diagram of a preferred embodiment of a quality comparison device in an adaptive balance filter according to the invention, as shown in FIG. 1.

The quality comparator 19 of FIG. 1 is preferably constructed in accordance with an exemplary embodiment shown in FIG. 2. This embodiment includes a third subtractor 25 having an inverting input which forms the input 3 and a noninverting input which forms the input 2 of the quality comparator 19. An input of a first absolute value former 26 forms the input 1 of the quality comparator 19. Inputs of second and third absolute value formers 27 and 28 are respectively connected to a noninverting input and an output of the subtractor 25. Outputs of the absolute value formers 26, 27 and 28 are each respectively carried to an input of a respective first, second and third logarithm module 29, 30 and 31. An inverting input of a fourth subtractor 32 is connected to an output of the logarithm module 29 and a noninverting input of this subtractor 32 is connected to an output of the logarithm module 30. A low-pass first filter 33 follows this subtractor 32. In the same way, an output of the logarithm module 30 is carried to a noninverting input, and an output of the logarithm module 31 is carried to an inverting input, of a fifth subtractor 34, which in turn is followed by a second low-pass filter 35. An output signal QUAL of the low-pass filter 35 is applied to an inverting input of a sixth subtractor 36 having a noninverting input at which the quality signal QUALS furnished by the low-pass filter 33 is applied. An output of the subtractor 36 generates a quality difference signal, which is preferably low-pass filtered through the use of a third low-pass filter 37 and which forms the quality difference signal DQUAL.

Figure 3:
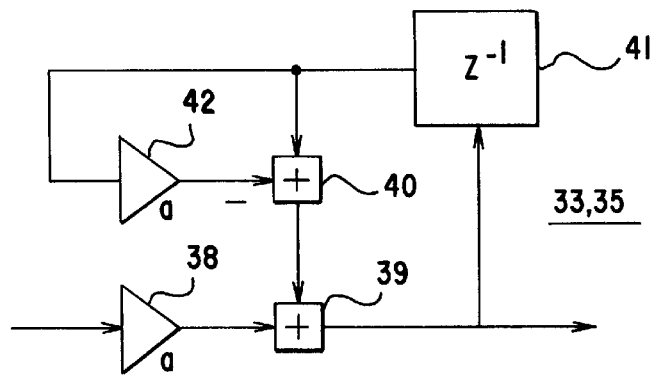
FIG. 3 is a schematic and block circuit diagram of a preferred embodiment of a low-pass filter contained in a transfer device of FIG. 2.

A preferred embodiment of the low-pass filters 33 and 35 is shown in FIG. 3. A signal that is furnished by the subtractor 32 or 34 is fed to a coefficient multiplier 38 which multiplies it by a coefficient a and supplies it to an adder 39 that also receives an output signal of a subtractor 40. The output signal of the adder 39 forms the output signal of the low-pass filter 33 or 35, that is the quality signal QUALS or the signal QUAL, respectively. A delay element 41 which is also connected to the output of the adder 39 has an output that is connected directly to a noninverting input of the subtractor 40 and is connected through a coefficient multiplier 42 for multiplication by the coefficient a, to an inverting input of the subtractor 40. The use of this structure is not merely limited to the low-pass filters 33 and 35 but instead can also be employed in the low-pass filter 37. In that case, instead of the coefficient a, some different coefficient should be used.

Figure 4:
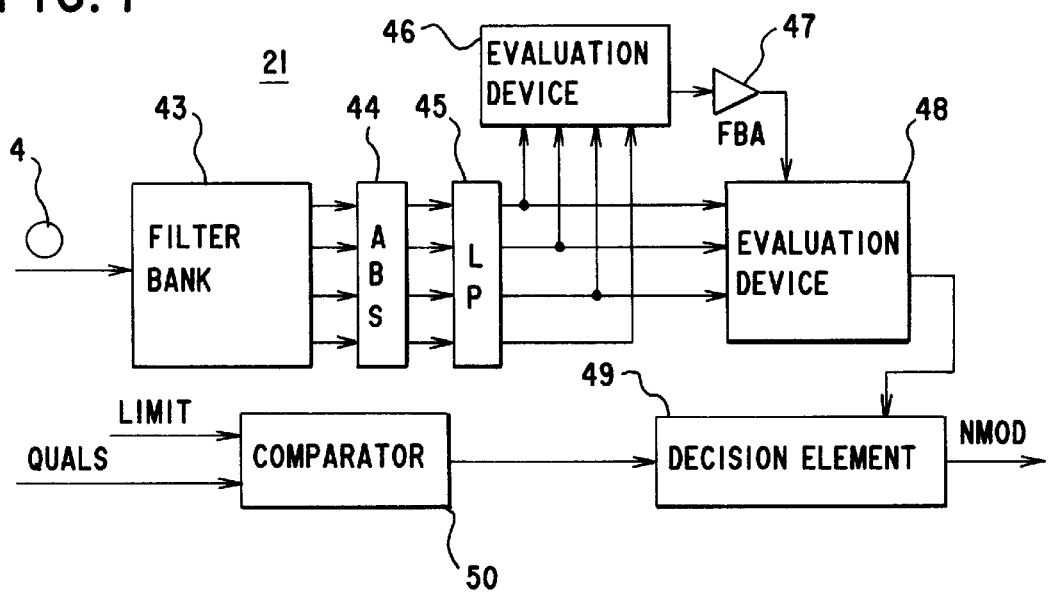
FIG. 4 is a block circuit diagram of a preferred embodiment for operating mode recognition in the transfer control device of FIG. 2.

The operating mode recognition device 21, as shown in FIG. 4, preferably includes a filter bank 43, to which the output signal of the form filter 6 is delivered and which by way of example outputs four frequency-specific output signals. The output signals of the filter bank 43 are carried to a further absolute value forming device 44, which includes a number of absolute value formers corresponding to the number of output signals. This absolute value forming device 44 is in turn followed by a low-pass filtering unit 45, with the same number of low-pass filters. Output signals of the low-pass filtering unit 45 are applied to a mean value former 46, which generates an output signal from the output signals of the low-pass filtering unit 45. The output signal is delivered to an evaluation device 48, with the interposition of a constant multiplier 47 for multiplication by a constant FBA. Three of the four output signals of the low-pass filter device 45 are also applied to the evaluation device 48. One input of a decision element 49 is connected to an output of the evaluation device 48. Another input of the decision element 49 is coupled to an output of a comparator 50. The comparator 50 has inputs to which the quality signal QUALS and a comparison value limit are applied. The enable signal NMOD is furnished at an output of the decision element 49.

The adaptive balance filters according to the invention in terms of the above-described exemplary embodiments are implemented as a microprogram in a signal processor. However, it can also be installed in all other types of data processing devices, such as microcontrollers, microcomputers, microprocessors, and so forth, and can also be realized entirely or partially by hardware. In software versions, the various function blocks represent individual program parts, while in hardware versions they represent hard-wired circuit elements.

Now that the basic structure of a balance filter according to the invention has been described above, the mode of operation of the balance filter will be discussed below. In the adaptive balance filter of the invention, it is assumed that the adaptive filter 5 largely repeatedly readjusts its coefficients. In the event that only one of the telephone subscribers (the A subscriber) is speaking, the echo attenuation of the adaptive filter 5 will become greater than the echo attenuation of the main filter 15. In that case, the coefficients of the adaptive filter 5 are copied into the main filter 15. In the case where both subscribers are speaking at once, the echo attenuation of the adaptive filter 5 will recede, because of the continuing readjustment of the coefficients of the adaptive filter 5 and because the signal of the other subscriber (B subscriber) falsifies the readjustment. The echo attenuation of the adaptive filter 5 is therefore poorer than the echo attenuation of the main filter 15. In that case, the coefficients are not copied.

The coefficients of the adaptive filter 5 are copied whenever its echo attenuation is better than the echo attenuation of the main filter 15. As a consequence, a copying operation can take place even when speech is occurring simultaneously. For instance, directly after activation of the balance filter, all of the coefficients are reset to zero. The echo attenuation of both the adaptive filter 5 and the main filter 15 is equal to zero. The adaptive filter will admittedly not attain the maximum possible echo attenuation by re-adjustment of its coefficients, but will at least attain a certain echo attenuation. The echo attenuation of the main filter 15, conversely, remains at zero. Thus the condition for copying the coefficients is fulfilled.

In order to prevent the coefficients of the adaptive filter 5 from being adjusted totally wrongly, the readjustment of the coefficients of the adaptive filter 5 is enabled or stopped through the use of a simple comparison of the main energies of the transmitted and received signals. A misadjustment could occur, for instance, if only the B subscriber is speaking.

The devices 24, 23 for ascertaining the transmission and reception powers average the powers of the signals on the transmission and reception paths 7, 14. The enable device 22 evaluates the averaged powers and controls the readjustment of the coefficients of the adaptive filter 5. In order for the coefficients to be readjusted by the LMS algorithm, two conditions must be met. First, the transmission power must exceed an adjustable first value, and second, the difference between the transmission power and the reception power must exceed a certain adjustable second value. The second value should be established in such a way that control still is performed when the line is open. As soon as the B subscriber speaks, the readjustment is stopped. In this operating case, the control functions ideally. However, during a connection that has been made, the trans-hybrid loss becomes substantially greater and thus the fed-back transmitted signal becomes considerably smaller than when a line is open. However, in that case, the adjusted threshold value for the difference between the transmission power and the reception power is markedly too small. In order then to enable stopping the readjustment, the B subscriber must be markedly louder than the A subscriber. However, this prevents only a complete adjustment of the adaptive filter 5. That is, when both subscribers are speaking at once, the adaptive filter 5 is not ideally adjusted, and in that case the coefficients should not be copied.

However, one consequence of controlled copying of the coefficients is that a certain reaction time is involved, since it is necessary first to assure that the adjustment of the adaptive filter 5 is better than the adjustment of the main filter 15, before the coefficients are copied. A reaction time of 20 to 80 ms is hardly perceptible to human hearing and is therefore acceptable. However, in acceptance measurements by the German Postal System, for instance, some measurements are done with a sine wave tone that rapidly runs through its frequencies. The reaction time is then perceived negatively, since the measurements are always optimal only if the coefficients are just then being copied. In order to overcome the disadvantage of the reaction time during the acceptance measurement, two operating modes are distinguished in the copy control device 18. The identification of the two operating modes is performed by the device for recognizing the operating modes 21. It is essential for the operation of the adaptive balance filter of the invention that the coefficients be copied only whenever the echo attenuation of the adaptive filter 5 is better than that of the main filter 15. Since all that is required for the decision as to when the coefficients should be copied is a comparison of the two echo attenuations, the absolute value of the particular echo attenuation need not be known.

The signal of the B subscriber is identical at the noninverting input and at the output of the subtractor 16, since the main filter 15 cannot compensate for the B subscriber. The echo signal of the A subscriber only appears in the signal at the output of the subtractor 16 in reduced form. A signal obtained by a comparison of the signals at the noninverting input and at the output of the subtractor 16 is therefore equivalent to the absolute echo attenuation of the adaptive balance filter only when the B subscriber is not talking. During a conversation, this value is merely a measure of the attenuating quality of the adaptive balance filter.

The signals at the noninverting input and at the output of the subtractor 12 are used to evaluate the attenuating quality of the adaptive balance filter. These two signals are delivered directly to the quality comparator 19. However, the corresponding signals for the main filter 15 have yet to be ascertained. In order to enable an effective comparison between the adaptive filter 5 and the main filter 15, the output signal of the main filter 15 is preferably carried through the form filter 20 to the quality comparator 19. The output signal of the form filter 20 is subtracted, within the quality comparator 19, from the output signal of the form filter 13 applied to the input 2. The signal obtained by the subtraction represents the standardized error signal of the main filter 15. In contrast, the signal present at the input 1 forms the error signal 9 of the adaptive filter 5.

As a criterion for the attenuating quality of the adaptive filter 5 and the main filter 15, the absolute value of the error signal 9 of the adaptive filter 5, which is present at the input 2, and the standardized error signal of the shadow filter 15 is formed, and in turn the logarithm thereof is formed. The logarithmized error signal of the adaptive filter 5 is subtracted from the logarithmized output signal of the form filter 13 and averaged by the low-pass filter 35.

The logarithmized, standardized error signal of the main filter 15 is subtracted from the logarithmized output signal of the form filter 13 and is likewise averaged by the low-pass filter 33. The output signal QUAL of the low-pass filter 35 is a measure of the attenuating quality of the main filter 15. The output signal QUALS is a measure of the quality of the adaptive filter 5, and for that reason is referred to as the quality signal QUALS. In order to attain optimal results of comparison, the time constants of the two low-pass filters 33 and 35 are preferably chosen to be identical. Typical values, for instance, are time constants between 20 ms and 50 ms. If the time constants are shorter, then although a change in the quality is recognized faster, nevertheless there is greater error in the averaging. If the time constants are greater, the averaging is more accurate but the quality determination reacts more sluggishly.

In order to decide which of the two filters, the adaptive filter 5 or the main filter 15, is adjusted better, the signal QUAL, which stands for the quality of the main filter 15, is subtracted from the quality signal QUALS, which stands for the quality of the adaptive filter 5. The signal thus obtained is preferably low-pass filtered. The output signal DQUAL of the low-pass filter 37 thus characterizes the difference in quality between the adaptive filter 5 and the main filter 15. If the quality difference signal DQUAL is positive, then the adaptive filter 5 is better adjusted than the main filter 15. The time constant of the low-pass filter 37 may, for instance, assume values between 10 ms and 40 ms. Averaging of the output signal of the subtractor 36 can be omitted if a greater time constant has already been chosen for the two low-pass filters 33 and 35.

In the event that only the A subscriber is talking, the quality signal QUALS is a measure for the echo attenuation of the adaptive filter 5. It can be learned from the quality difference signal DQUAL which of the two filters, the adaptive filter 5 or main filter 15, is better adjusted. If the B subscriber interrupts the A subscriber, then both the quality signal QUALS and the quality difference signal DQUAL will become smaller, since the echo attenuation becomes smaller as a percentage of the power of the signal on the reception path 14. In addition, because of the influence of the B subscriber signal on the readjustment of the coefficients, the echo attenuation of the adaptive filter 5 will become worse, thus further reducing the signals QUALS and DQUAL. Both effects prevent the coefficients of the adaptive filter 5 from being mistakenly copied if both subscribers are talking at once. Both effects therefore enable stable operation of the copy control device 18. If the coefficients of the adaptive filter 5 are shifted such as, for instance, after the first time that the adaptive balance filter is turned on, then it can certainly happen that the quality difference signal DQUAL becomes so great that the coefficients are copied despite the simultaneous speech. Nevertheless, because of the two effects just described, it is assured that the adaptive filter 5 in each case will have a better adjustment than the main filter 15.

If the balance filter is implemented in a digital signal processor, for instance, the signals are in the form of binary numbers, and the logarithmizing required within the quality comparator 19 can be carried out with very simple provisions. An approximated logarithm to base 2 is obtained, for instance, through the use of a standardizing unit. All that is required is the location of the leading 1 (exponent) and the least significant bits after the leading 1 (mantissa). If the binary number of the exponent is placed before the binary number of the mantissa, the result obtained is an approximated logarithm. In order to preclude possible inaccuracies of calculation of the trailing bits of the input words applied to the logarithm formers 29, 30, 31 from affecting the output signals of the quality comparator 19, the logarithm former can be provided with a programmable threshold. To that end, a programmable fixed value is subtracted from the input or output signal of the respective logarithm former. If the result is negative, then the result of the subtraction is set at zero.

A simple embodiment of the low-pass filters 33 and 35 and possibly of the low-pass filter 37 on a digital signal processor is shown in the exemplary embodiment of FIG. 3. The output signal of the respective low-pass filter, delayed by one scanning cycle or clock, is multiplied by a coefficient a. The outcome of this multiplication is subtracted from the output signal delayed by one cycle, and to this value the input signal of the respective low-pass filter, multiplied by the coefficient a, is added. The value obtained by the addition is the new starting value of the low-pass filter. The coefficient a determines the time constant $\tau$ of the low-pass filter. The following relationship exists between the time constant $\tau$, the coefficient a and the time T between two scanning values:

$$\tau = \frac{T}{ln(1-a)} .$$

Depending on the time constant being chosen, the coefficient a can be replaced with a simple operation of shifting to the right. This is always the case whenever the following values are chosen for the coefficient a:

$$a = \frac{1}{2}n$$

$$n = 1, 2, 3. \ldots$$

A finite delay time occurs between the change in the echo attenuation and the complete readjustment of the signals QUALS and DQUAL as a condition of the time constants of the low-pass filters 33 and 35 and optionally of the low-pass filter 37. As a result, it is possible for the coefficients of the adaptive filter 5 not to be copied until whenever the adaptive filter 5 has attained a better echo attenuation for a certain period of time than the main filter 15. This is also intentional because it should be assured that coefficients of the adaptive filter 5 are better than those of the main filter 15 before a copying operation is initiated. In practical operation of the adaptive balance filter, the delay time is hardly perceptible and therefore is not found irritating.

In the acceptance measurements of the German Postal System, for instance, in which a sine wave tone that rapidly traverses various frequencies is fed in, the adaptive filter 5 adapts its coefficients relatively rapidly to each of the frequencies. However, because there is little frequency information in the sine wave signal, the echo attenuation of the adaptive filter 5 is optimally adjusted only for the particular applied frequency of the sine wave tone. In the case of all of the other frequencies, the echo attenuation is undefined. However, since the coefficients are only copied whenever the adaptive filter 5 has better echo attenuation than the main filter 15 for a certain period of time, because of the delay time, the echo attenuation of the main filter 15 will always be optimal only immediately after a copying operation.

In order to circumvent those problems, two different operating modes have been defined. Immediately after the adaptive balance filter has been turned on, the enable signal NMOD is equal to zero. In that case, the copy control device 18 is instructed to copy the coefficients continuously. As a result, the main filter 15 continuously receives the current coefficients of the adaptive filter 5 and can consequently compensate for the sine wave. It is only once the operating mode detection device 21 has detected speech that the enable signal NMOD is set equal to one, with an ensuing changeover to the normal operating mode. It is only in the normal operating mode that the signals QUALS and DQUAL are evaluated by the copy control device. The copying of the coefficients initiated by the copy signal ECPY is dependent on the comparison of the attenuating qualities of the adaptive filter 5 and the main filter 15.

The operating mode recognition device 21, as shown in FIG. 4, preferably includes the filter bank 43, which breaks down the output signal of the form filter 6, for instance into four signals each being associated with one frequency band. Preferably, the pass ranges of the four band passes do not overlap. The choice of the steepness and bandwidth of the various band passes is relatively uncritical, because a sine wave signal can appear in a maximum of two adjacent frequency bands. The absolute value is formed for each of the four output signals of the filter bank 43 and then averaged with the aid of the low-pass filters 45. If needed, a logarithmizer can be provided between the low-pass filter 45 and the absolute value former 44 for each of the individual signals. The signals at the outputs of the low-pass filter 45 are delivered to the average value former 46, which calculates the mean value of the four signals. The mean value is then multiplied by the factor FBA, which is adjustable and must be smaller than one. The result of the multiplication is a comparison value for the evaluation device 48. The evaluation device or unit 48 compares the averaged values of the lowermost three frequency bands with the comparison value. The output signal of the evaluation unit 48 becomes precisely one whenever all three averaged values of the three lower frequency bands are above the comparison value. It is then in fact that the spectrum of the signal at the input of the adaptive filter 5 has substantial proportions in the lowermost three frequency bands. Since frequencies below 3000 Hz primarily occur as a rule in speech, the evaluation of the upper frequency range, which is preferably above 3000 Hz, can be omitted.

In the case of the switchover to the normal operating mode, not only a corresponding frequency spectrum but also a certain echo attenuation of the adaptive filter 5 are required. Through the comparison of the quality signal QUALS, which is a measure for the echo attenuation of the adaptive filter 5, with a freely adjustable minimum value, a decision is made as to whether or not the desired echo attenuation has been achieved. If the quality signal QUALS is greater than the adjustable value Limit, then the output signal of the comparator 50 becomes one. Otherwise, the output signal becomes zero. The decision element 49 determines when a transition to the normal operating mode will occur from the output signals of the comparator 50 and the evaluation device 48. The enable signal NMOD changes precisely to one and thus signals the normal operating mode whenever the output signal of the evaluation unit 48 and the output signal of the comparator 50 are simultaneously and constantly equal to one for an adjustable period of time. The spectrum of the signal present at the input of the adaptive filter 5 and the echo attenuation of the adaptive filter 5 are then better than what was desired, for the particular period of time.

Once a change has been made to the normal operating mode, the adaptive balance filter remains in the normal operating mode until such time as it is reset again.

If the enable signal NMOD is equal to zero and the adaptive balance filter is thus not yet in the normal operating mode, then the coefficients of the adaptive filter 5 are continuously copied into the main filter 15. It is not until the enable signal NMOD is equal to one that the copying of the coefficients is controlled in a targeted way.

If the enable device 22 stops the readjustment of the coefficients of the adaptive filter 5 by resetting the enable signal EUPD to zero, because it has detected speech from both parties, then the copying of the coefficients is suppressed in each case. In the event that speech from both parties has been detected, then it must be assumed that the adaptive filter 5 has been regulated out of its previous optimum situation by the B subscriber. It is therefore inappropriate to copy the coefficients.

In order to ensure that when the adaptive balance filter is first adjusted the speed of adjustment will not be determined by the time constants of the low-pass filters in the quality comparator 19, that is the low-pass filters 33, 35 and 37, the damping quality QUALS of the adaptive filter 5 is compared with its previously attained maximum value. If the current attenuation quality QUALS of the adaptive filter 5 is greater than the former maximum value, then the coefficients are copied. As a result, only the time constant of the low-pass filter 33, but not the time constant of the low-pass filter 37, determines the transient recovery behavior.

Since a great echo attenuation is attained above all in signals having a frequency spectrum which includes only a few frequency components, the situation in which attenuation is achieved after a very great echo and the coefficients can practically no longer be copied must be averted. This is accomplished by comparing the quality difference signal DQUAL with an adjustable value. If the quality difference signal DQUAL is greater than an adjusted value of a parameter DELQ, then the coefficients are copied. The parameter DELQ assumes a value that is equivalent to an echo attenuation of approximately 3 dB, for instance. Such a comparison is also necessary if the line impedance changes and thereafter only worse echo attenuation can be attained. Since the maximum value is automatically set, upon a copying operation, to the current quality value of the adaptive filter 5, it is assured that in the event that the echo attenuation of the adaptive filter 5 rises further after a copying operation, the coefficients of the shadow filter 15 and therefore of the entire adaptive balance filter are immediately readjusted. For instance, if the line impedance changes during a conversation, the copying operation following the change in the echo path is initiated on the basis of a comparison of the quality difference signal DQUAL with a fixedly specified parameter DELQ. The quality difference signal DQUAL must be greater than the parameter DELQ.

By setting a maximum value QMAXS equal to the quality signal QUALS, the further copying operations are brought about by the comparison of the quality signal QUALS with the maximum value QMAXS. In the case of the quality difference signal DQUAL, the time constant of the low-pass filter 37 is subsequently no longer involved in the initial adjustment speed of the main filter 15. If the main attenuation of the shadow filter 15 is to be precisely as great as the echo attenuation of the adaptive filter 5, then one further condition for copying of the coefficients must be provided. A further condition for the copying of the coefficients is that the quality difference signal DQUAL be greater than zero, or in other words that the adaptive filter size be better adjusted than the main filter 15. Since the values for the signals QUALS and QUAL change to zero if both subscribers are speaking at the same time, then for a copying operation not only must the quality difference signal DQUAL be greater than zero, but the quality signal QUALS must additionally be greater than the adjustable value Limit. This means that the quality of the adaptive filter 5 must exceed a minimum value. In order to increase the certainty of the copying decision, the aforementioned two conditions must be met for a predetermined period of time if the coefficients are to be copied on the basis of those conditions. In order for the predetermined period of time to be able to fulfill its purpose, it must be reset every time, as soon as it is ascertained that the coefficients may be copied, or must not be copied.

Once a copying operation has been brought about, it is recommended but not absolutely necessary that the signal QUAL and correspondingly the internal memory cell of the associated low-pass filter 35 be set to the value of the quality signal QUALS. As a result it is attained that directly after a copying operation, a new copying operation can be brought about only if the condition is present that the quality signal QUALS is greater than the maximum value QMAX. This is because in this case the values for the signals QUAL, QUALS and DQUAL vary only with the adjusted time constants. This means that immediately after a copying operation, the condition DQUAL>DELQ must continue to be capable of being met.

This is prevented by setting the signals QUAL and QUALS equal to one another. The signal DQUAL must therefore be smaller after a copying operation. For the reasons just given, the quality difference signal DQUAL during a copying operation could also be set to zero.

The course of the function within the copy control device 18 is shown in detail below in terms of a C program. Besides the signals and variables already mentioned, a counter variable for generating the time period is designated as ZTIMQ, and adjustable parameters for the limit value Limit, the minimum value of the quality difference signal DQUAL, and the duration of the time period, respectively, are designated as LIMQ, DELQ and TIMQ. The program reads:

an adaptive filter having a signal output, a coefficient output for outputting filter coefficients, an error signal input, and a signal input coupled to said transmission path;

a main filter having a signal output, a signal input coupled to said transmission path, and a coefficient input for loading filter coefficients;

a first subtractor having one input coupled to said reception path, another input coupled to the signal output of said main filter, and an output forming a further course of said reception path;

a second subtractor having one input coupled to said reception path, another input coupled to the signal output of the adaptive filter, and an output coupled to the error signal input of said adaptive filter;

a transfer device being connected between the coefficient output of said adaptive filter and the coefficient input of said main filter and having a control input for loading the filter coefficients of said adaptive filter into said main filter upon an appearance of a corresponding copy signal; and a transfer control device having first, second and third inputs, the first input being coupled to the output of said second subtractor, the second input being coupled to the one input of said second subtractor, and the third input being coupled to the output of said main filter;

said transfer control device ascertaining echo attenuations of said adaptive filter and said main filter from signals at the first, second and third inputs, comparing two echo attenuations with one another, and sending a corresponding copy signal to said transfer device in the event that the echo attenuation of said adaptive filter is higher than the echo attenuation of said main filter; and said transfer control device having a quality comparison device and a copy control device;

said transfer control device including:
a third subtractor having one input forming the second input and another input forming the third input of said transfer control device;
a first absolute value former having an input forming the first input of said transfer control device;
a second absolute value former having an input being connected to the one input of said third subtractor;
a third absolute value former connected downstream of said third subtractor;
first, second and third logarithm modules each being connected downstream of a respective one of said

```
if (!NMOD) {ZTIMQ=0; ECPY=TRUE; QUAL=QMAXS=QUALS;}
else
    if (!EUPD) {ZTIMQ=0; ECPY=FALSE;}
    else
        if (QUALS>QMAXS) {ZTIMQ=0; ECPY=TRUE; QUAL=QMAXS=QUALS;}
        else
            if (DQUAL>DELQ) {ZTIMQ=0; ECPY=TRUE; QUAL=QMAXS=QUALS;}
            else
                if (DQUAL>0) && (QUALS>LIMQ) {
                    if (ZTIMQ>TIMQ) {ZTIMQ=0; ECPY=TRUE;
                        QUAL=QMAXS=QUALS;}
                    else {ZTIMQ++; ECPY=FALSE;}
                } else {ZTIMQ=0; ECPY=FALSE;}
```

I claim:

1. An adaptive balance filter, comprising:

a transmission path;

a reception path;

first, second and third absolute value formers and each having an output;

a fourth subtractor having inputs each being connected to the output of a respective one of said first and second logarithm modules;

a fifth subtractor having inputs each being connected to the output of a respective one of said second and third logarithm modules;

first and second low-pass filters each being connected downstream of a respective one of said fourth and fifth subtractors and each having an output; and a sixth subtractor having inputs being connected to the outputs of said first and second low-pass filters, and an output supplying a quality difference signal;

said copy control device having an input being coupled to the output of said sixth subtractor, for comparing the quality difference signal with a first comparison value and generating a copy signal for said transfer device if the quality difference signal and the first comparison value differ in a certain direction, the first comparison value being set equal to a current value of the quality difference signal.

2. The balance filter according to claim 1, including:

a first form filter connected between the one input of said second subtractor and said reception path;

a second form filter having a transmission behavior being identical to said first form filter and being connected between said transmission path and the signal input of said adaptive filter; and a third form filter having a transmission behavior being identical to said first form filter and being connected between the output of said main filter and the third input of said transfer control device.

3. The balance filter according to claim 1, including a third low-pass filter connected downstream of said sixth subtractor.

4. The balance filter according to claim 1, wherein said transfer control device includes:

devices for ascertaining a power of a transmitted signal present at the input of said adaptive filter and a power of a reception signal present at the one input of said second subtractor; and an enable device connected downstream of said devices for ascertaining the transmission and reception power, for outputting an enable signal to said copy control device to enable the copy signal whenever the transmission power signal exceeds a first reference value and a difference between the transmission power signal and the reception power signal exceeds a second reference value.

5. The balance filter according to claim 4, wherein the enable signal is also delivered to said adaptive filter; and said adaptive filter does not adapt until the enable signal appears.

6. The balance filter according to claim 1, wherein said transfer control device has an operating mode recognition device for evaluating a signal at the input of said adaptive filter for broad bandedness and narrow bandedness, and for supplying an enable signal for said copy control device upon the presence of a wideband signal.

7. The balance filter according to claim 6, wherein said operating mode recognition device includes:

a filter bank being triggered with the input signal of said adaptive filter and having a plurality of frequency band-specific outputs;

further absolute value formers connected downstream of the outputs of said filter bank;

further low-pass filters being connected downstream of said further absolute value formers and having outputs;

a mean value former being connected to the outputs of said low-pass filters and having an output;

a constant multiplier being connected downstream of the output of said mean value and having an output; and an evaluation device connected to the output of said constant multiplier and to the outputs of said low-pass filters, for comparing various frequency band-specific signals present at the outputs of said low-pass filters with a comparison signal output by said constant multiplier and outputting a bandwidth signal if the comparison signal is exceeded by a maximum of two frequency-specific signals.

8. The balance filter according to claim 7, including:

a comparator having one input receiving a quality signal, another input receiving an attenuation reference signal corresponding to a given echo attenuation, and supplying an output signal; and a decision element linking the bandwidth signal and the output signal of said comparator to one another for supplying an enable signal for said copy control device in the presence of a bandwidth signal corresponding to a wide bandedness of the signal at the output of said adaptive filter and in the presence of an output signal of said comparator corresponding to a certain echo attenuation.

9. The balance filter according to claim 1, wherein:

a) if the enable signal is absent, said copy control device:
   resets an internal counter,
   generates a copy control signal for copying the coefficients of said adaptive filter to said main filter,
   sets the output signal of said second low-pass filter to be equal to the quality signal, and
   sets a maximum value variable to be equal to the quality signal; and otherwise b) if the first enable signal is absent, said copy control device:
   resets the internal counter; and otherwise c) if the output signal of said first low-pass filter is greater than the maximum value variable, said copy control device:
   resets the internal counter,
   generates a copy control signal for copying the coefficients of said adaptive filter to said main filter,
   sets the output signal of said second low-pass filter to be equal to the quality signal, and
   sets the maximum value variable to be equal to the quality signal; and otherwise, d) if the quality difference signal is greater than a quality parameter, said copy control device:
   resets the internal counter,
   generates the copy control signal,
   sets the output signal of said second low-pass filter to be equal to the quality signal, and
   sets the maximum value variable to be equal to the quality signal.

10. The balance filter according to claim 9, wherein, otherwise:

e) if the quality difference signal is greater than zero and the quality signal is greater than a limit value parameter, and i) if a counter state is greater than a time parameter, said copy control device:
   resets the internal counter,
   generates the copy control signal,
   sets the output signal of said second low-pass filter to be equal to the quality signal, and
   sets the maximum value variable to be equal to the quality signal, and ii) in other cases, said copy control device:
   resets the internal counter, and otherwise f) resets the counter.

11. The balance filter according to claim 1, wherein the balance filter is at least partially realized in the form of a suitably programmed data processing system.

* * * * *